United States Patent
Park et al.

(10) Patent No.: US 8,325,457 B2
(45) Date of Patent: Dec. 4, 2012

(54) ELECTROSTATIC CHUCK AND DEVICE OF MANUFACTURING ORGANIC LIGHT EMITTING DIODE HAVING THE SAME

(75) Inventors: Sang-Young Park, Yongin (KR); Ju-Eel Mun, Yongin (KR); You-Min Cha, Yongin (KR); Won-Woong Jung, Yongin (KR)

(73) Assignee: Samsung Display Co., Ltd., Gibeung-Gu, Yongin, Gyeonggi-Do (KR)

( * ) Notice: Subject to any disclaimer, the term of this patent is extended or adjusted under 35 U.S.C. 154(b) by 323 days.

(21) Appl. No.: 12/585,895

(22) Filed: Sep. 28, 2009

(65) Prior Publication Data

US 2010/0188794 A1 Jul. 29, 2010

(30) Foreign Application Priority Data

Jan. 23, 2009 (KR) .................. 10-2009-0006200

(51) Int. Cl.
*H01T 23/00* (2006.01)
(52) U.S. Cl. ........................ 361/234; 361/230
(58) Field of Classification Search .............. 361/234, 361/230
See application file for complete search history.

(56) References Cited

U.S. PATENT DOCUMENTS

| | | |
|---|---|---|
| 5,382,311 A | 1/1995 | Ishikawa et al. |
| 5,474,614 A | 12/1995 | Robbins |
| 2007/0000441 A1 | 1/2007 | Lue |
| 2007/0223173 A1 | 9/2007 | Fujisawa et al. |
| 2010/0149720 A1 | 6/2010 | Fujisawa et al. |

FOREIGN PATENT DOCUMENTS

| | | |
|---|---|---|
| JP | 06-188305 | 7/1994 |
| JP | 06-267899 | 9/1994 |
| JP | 06-275546 | 9/1994 |
| JP | 06302678 | 10/1994 |
| JP | 2002219355 A | 8/2002 |
| JP | 2002-222799 | 9/2002 |
| JP | 2002313902 | 10/2002 |
| JP | 2003-017255 | 1/2003 |
| JP | 2003017255 A | 1/2003 |
| JP | 2003-309156 | 10/2003 |

(Continued)

OTHER PUBLICATIONS

Search report from European Patent Office issued in Applicant's corresponding European Patent Application No. 09175414.3 dated Mar. 1, 2010.

(Continued)

*Primary Examiner* — Danny Nguyen
(74) *Attorney, Agent, or Firm* — Robert E. Bushnell, Esq.

(57) ABSTRACT

The present invention discloses an electrostatic chuck sucking and supporting a substrate with an electrostatic force and an OLED manufacturing apparatus having the same. The electrostatic chuck includes an insulating plate having at least one opening penetrating a center thereof, a pair of electrodes mounted on the insulating plate, a first controller applying a voltage to the pair of electrodes, and an electrostatic charge removing unit disposed near the insulating plate and emitting ions into the at least one opening to remove electrostatic charges distributed around a side of the insulating plate.

20 Claims, 6 Drawing Sheets

FOREIGN PATENT DOCUMENTS

| | | |
|---|---|---|
| JP | 2003309156 A | 10/2003 |
| JP | 2004022979 | 1/2004 |
| JP | 2004-183044 | 7/2004 |
| JP | 2004183044 A | 7/2004 |
| JP | 2004362951 A | 12/2004 |
| JP | 2005-093919 | 4/2005 |
| JP | 2006-228681 | 8/2006 |
| JP | 2006228681 A | 8/2006 |
| JP | 2007-311462 | 11/2007 |
| JP | 2007311462 A | 11/2007 |
| JP | 2008198533 A | 8/2008 |
| JP | 2008-282875 | 11/2008 |
| JP | 2008-294257 | 12/2008 |
| KR | 10-2000-0031307 | 6/2000 |
| KR | 10-2001-0091088 | 10/2001 |
| KR | 20060069113 A | 6/2006 |
| KR | 1020070066390 A | 6/2007 |
| KR | 20080058144 A | 6/2008 |
| WO | 2005/091356 | 9/2005 |
| WO | 2005091356 A | 9/2005 |

OTHER PUBLICATIONS

Japanese Office Action issued on May 24, 2011, corresponding to Korean patent application No. 10-2009-0006200 and Request for Entry of the Accompanying Office Action attached herewith.

Korean Office Action issued on Nov. 30, 2010 in the corresponding Korean Patent Application No. 10-2009-0006200 and Request for Entry of the Accompanying Document herewith.

Japanese Office Action issued by JPO on Oct. 4, 2011 in connection with Japanese Patent Application No. 2009-165792, which also claims Korean Patent Application No. 10-2009-0006200 as its priority document, and Request for Entry of the Accompanying Office Action attached herewith.

Japanese Office Action issued by Japanese Patent Office on Apr. 3, 2012 in connection with Japanese Patent Application No. 2009-165792, which also claims Korean Patent Application Serial No. 10-2009-0006200 as its priority document and Request for Entry of the Accompanying Office Action attached herewith.

Korean Office Action issued by KIPO dated Jul. 30, 2010, No. 10-2009-006200 together with Request for Entry.

ELECTROSTATIC CHUCK AND DEVICE OF MANUFACTURING ORGANIC LIGHT EMITTING DIODE HAVING THE SAME

CLAIM OF PRIORITY

This application makes reference to, incorporates the same herein, and claims all benefits accruing under 35 U.S.C. §119 from an application earlier filed in the Korean Intellectual Property Office on 23 Jan. 2009 and there duly assigned Serial No. 10-2009-0006200.

BACKGROUND OF THE INVENTION

1. Field of the Invention

The present invention relates to an electrostatic chuck upwardly sucking and supporting a substrate in a vacuum chamber and an organic light emitting manufacturing apparatus having the same.

2. Description of the Related Art

An organic light emitting diode (hereinafter, referred to as an "OLED") is a self-luminescent display device emitting light using phenomenon in which electrons and holes, which are injected through an anode and a cathode in an organic thin film of single molecular weight compound, low molecular weight compound, or polymer, are recombined with each other and form excitons and light of a specific wavelength is emitted by energy from the excitons.

An indium tin oxide (ITO) layer having a low surface resistance and excellent permeability can be used as an anode layer of the OLED. In order to increase luminous efficiency, an organic thin film having a multiple structure of hole injection layer (HIL), a hole transport layer (HTL), an emission layer (EML), an electron transport layer (ETL), and an electron injection layer (EIL) can be used. A metal layer such as LiF—Al can be used as a cathode layer.

Since an OLED display device using the OLED has excellent characteristics such as a wide viewing angle, a short response time, a low power consumption, and high brightness and is made very light in weight and very thin, the OLED display device is spotlighted as a next generation display. In spite of the excellent characteristics, an apparatus for manufacturing the OLED in commercial quantity is not standardized yet and therefore there is an urgent demand for development of an adequate manufacturing apparatus.

The manufacturing process of the OLED has a pre-process, a post-process, and an encapsulating process. The pre-process is a process of forming the ITO layer on a glass substrate mainly using a sputtering technology, and the manufacturing process for an LCD display is already commercialized. The encapsulation process is a process of encapsulating the organic thin film in order to increase life time of the OLED because the organic thin film is very weak against to moisture and oxygen in air. The post-process is a process of forming the organic thin film and a metal thin film on the glass substrate. As the post-process, a vacuum deposition of forming pixel patterning using a shadow mask on the glass substrate by evaporating the organic material under high vacuum atmosphere is mainly utilized.

It is important how to maintain the high vacuum during the post-process and how to achieve the high rate deposition as necessary requirements for the mass production of the OLED, and a large area substrate greater than 370×470 mm can be used in detail. Particularly, deflection of the large area substrate and the metal mask due to thermal expansion can be restricted at their maximum. These requirements are necessary even to guarantee uniformity of the organic thin film under ±5% in a face-down deposition of putting material to be deposited in a crucible to heat and evaporate the same and thus of forming a thin film on a substrate positioned above the crucible.

An electrostatic chuck can be used as a device for upwardly supporting the substrate in the deposition chamber. The electrostatic chuck is used so that the deflection of the substrate can be minimized.

However, in order to support the large area substrate with a sucking force, high voltage of several kV is applied to the electrostatic chuck. In this case, during the following dechucking, the substrate is not easily separated from the electrostatic chuck due to electrostatic charges remaining on the electrostatic chuck. That is, since, even after the high voltage for the electrostatic chuck is cut off, some of the electrostatic charges remain between the electrostatic chuck and the substrate, the electrostatic chuck still has a sucking force against the substrate. The sucking force makes handling of the substrate be difficult and causes a handling error. Therefore, time for the manufacturing process is increased and manufacturing efficiency is decreased.

SUMMARY OF THE INVENTION

Accordingly, it is an object of the present invention to provide an electrostatic chuck capable of stably controlling chucking and dechucking of a large area substrate within a high vacuum apparatus.

The present invention also provides a manufacturing apparatus of an organic light emitting diode capable of increasing quality of a formed thin film by removing deflection and excitation of a large area substrate during the upward support of the large area substrate.

In order to achieve the foregoing and/or other objects of the present invention, according to an aspect of the present invention, there is provided an electrostatic chuck including an insulating plate having at least one opening penetrating the insulating plate, a pair of electrodes mounted on the insulating plate, a first controller applying a voltage to the pair of electrodes, and an electrostatic charge removing unit disposed near the insulating plate and emitting ions into the at least one opening to remove electrostatic charges positioned around a side of the insulating plate.

Preferably, the at least one opening may have a stripe shape extending in a direction parallel to an edge of the insulating plate.

The pair of electrodes may be arranged in a laminated structure.

One of the pair of the electrodes and another of the pair of the electrodes may be arranged on the same plane that is substantially parallel to a surface of the insulating plate on which the at least one opening is formed.

The insulating plate can be made of a material including resin or ceramic.

The electrostatic chuck may further include a supporting member supporting the insulating plate. Moreover, the electrostatic chuck may further include a buffer layer formed between the insulating plate and the supporting member.

The electrostatic charge removing unit includes a discharging unit generating the ions by corona discharge; and a second controller applying a voltage to the discharging unit.

The discharging unit may be arranged to cover the at least one opening.

The electrostatic charge removing unit may further include a blowing unit compulsively blowing the ions generated in the discharging unit to the at least one opening. Moreover, The electrostatic charge removing unit may further include a sensor sensing a balanced state of positive ions and negative ions which are generated in the discharging unit and transmitting an output signal with respect to the sensed balanced state to the second controller.

According to another aspect of the present invention, there is provided an apparatus for manufacturing an organic light emitting diode including a vacuum chamber, an electrostatic chuck supporting a substrate in the vacuum chamber, and a mechanical unit coupled with the vacuum chamber and supporting and moving the electrostatic chuck.

Preferably, the mechanical unit includes a first mechanical unit supporting the insulating plate of the electrostatic chuck, and a second mechanical unit supporting the electrostatic charge removing unit of the electrostatic chuck.

The apparatus may further include an evaporation source evaporating an organic material or metal to a side of the substrate. According to the present invention, the chucking and dechucking are smoothly controlled in the high vacuum apparatus so that the support and transportation of the large area substrate can be easily performed. In addition, a mechanical tolerance between the suction unit and the substrate is substantially removed during the face-down chucking of the large area substrate so that the substrate to be fixed can have an excellent plane view. Therefore, the uniformity of the thin film formed on the substrate can be improved. Moreover, since the fine alignment of the substrate is easily performed during the deposition, the processing time can be reduced and the manufacturing apparatus of an OLED can be effectively used in manufacturing an OLED display in commercial quantity.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

Figure 1:
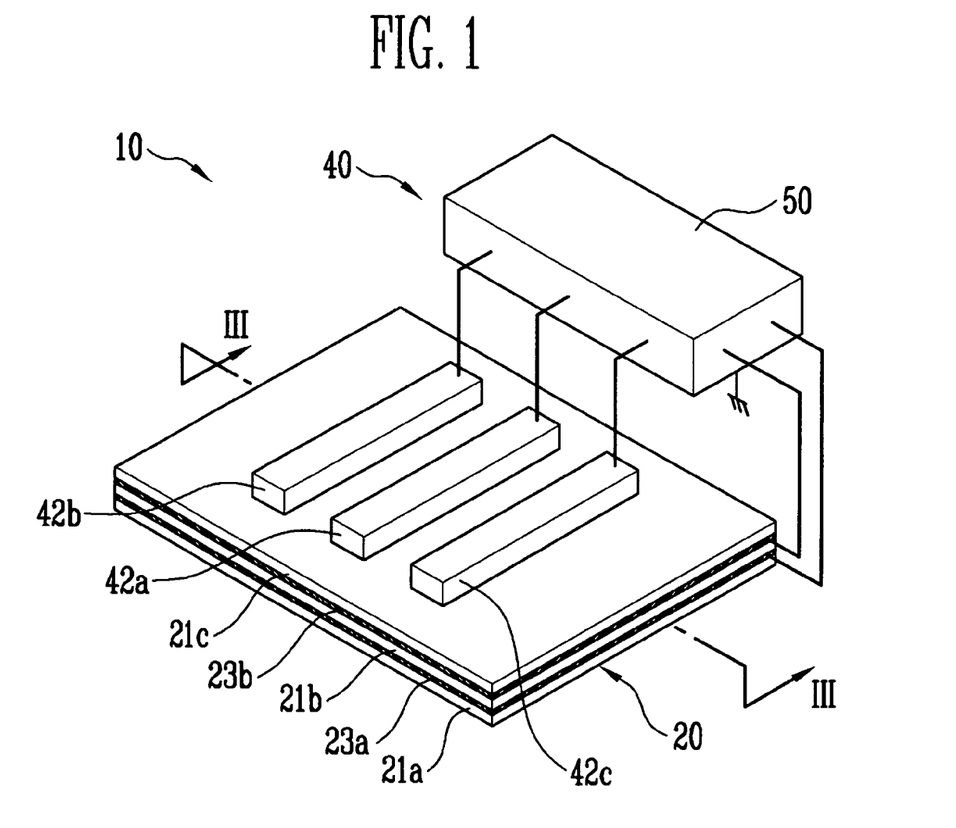
FIG. 1 is a schematic perspective view illustrating an electrostatic chuck according to an embodiment of the present invention.
Figure 2:
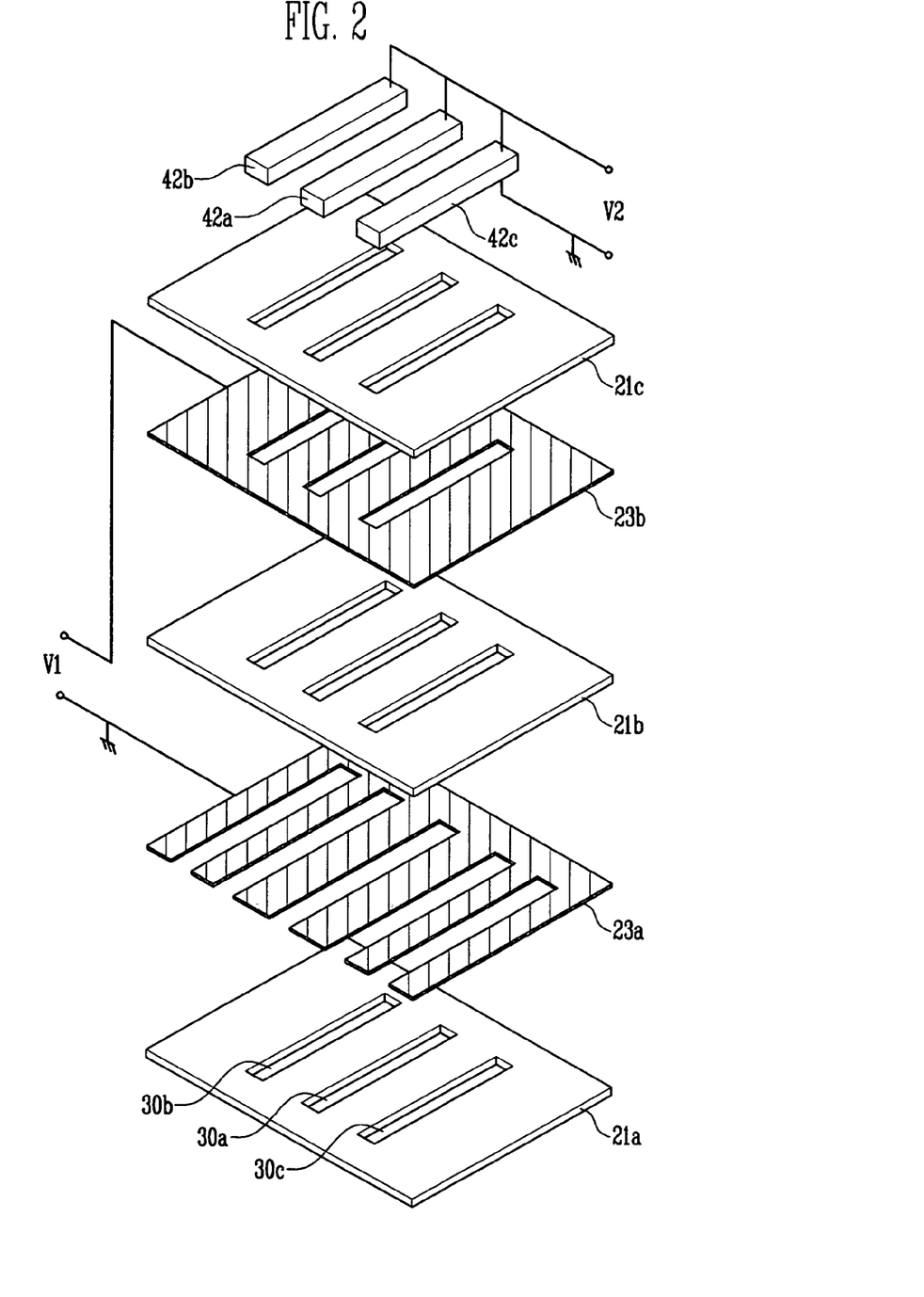
FIG. 2 is an exploded perspective view illustrating a part of the electrostatic chuck in FIG. 1.

FIG. 1 is a schematic perspective view illustrating an electrostatic chuck according to an embodiment of the present invention. FIG. 2 is an exploded perspective view illustrating a part of the electrostatic chuck in FIG. 1.

Referring to FIG. 1, an electrostatic chuck 10 according to an embodiment of the present invention includes a suction unit and an electrostatic charge removing unit 40 for easy suction and separation of a large area substrate in a high vacuum apparatus.

The suction unit suctions a target body with a gradient force that is generated in a non-uniform electric field formed due to induction of the electric field during the chucking of the electrostatic chuck 10. In this embodiment of the present invention, the suction unit includes an electrode pad 20 having an insulating plate and a pair of electrodes and a first controller applying voltage to the pair of electrodes.

The electrode pad 20 can be implemented in various types, and a bipolar electrode pad having a laminated structure is provided in this embodiment. For example, the electrode pad 20 includes a first insulating layer 21a, a first electrode layer 23a, an inter-electrode insulating layer 21b, a second electrode layer 23b, and a second insulating layer 21c. The first electrode layer 23a and the second electrode layer 23b form a pair of electrodes. Other parts of the electrode pad 20 except for the pair of electrodes are referred to as an insulating plate.

The first electrode layer 23a and the second electrode layer 23b can be made of copper, tungsten, aluminum, nickel, chrome, silver, platinum, tin, molybdenum, magnesium, palladium, and tantalum. Thickness of the first electrode layer 23a and the second electrode layer 23b can be selected arbitrary from a range of about 0.1 to 20 µm, and the thickness of the first electrode layer 23a is preferably 0.1 to 5 µm. This is to minimize that unevenness of the first electrode layer 23a is applied to a surface of the first insulating layer 21a which forms a sucked surface of a target body (for example, a substrate). When the thickness of the first electrode 23a is selected from a range of about 0.1 to 5 µm, the flatness of the sucked surface of the first insulating layer 21a can be guaranteed as a radius of curvature with 1 µm.

The first electrode layer 23a and the second electrode layer 23b can be formed in various types. For example, the first electrode layer 23a can be formed in a comb shape and the second electrode layer 23b can be formed in a seat shape having an opening (as shown in FIG. 2). Moreover, the first electrode layer 23a and the second electrode layer 23b can be formed by sputtering, ion platting, and plating.

The first insulating layer 21a, the inter-electrode insulating layer 21b, and the second insulating layer 21c can be made of a single or at least two resins which are selected from a group of polyimide, polyamideimide, polyester, polyethylene terephthalate, epoxy, and acrylic. On the other hand, the insulating layers 21a, 21b, and 21c can be made of a single or at least two ceramics selected from a group consisting of aluminum oxide, aluminum nitride, silicon carbide, silicon nitride, zirconia, and titania. Thickness of the respective insulating layers 21a, 21b, and 21c can be properly selected; the first insulating layer 21a may have a thickness of 50 to 300 µm, the inter-electrode insulating layer 21b may have a thickness of 25 to 100 µm, and the second insulating layer 21c may have a thickness of 25 to 100 µm.

In this embodiment of the present invention, the electrode pad 20 includes a plurality of openings 30a, 30b, and 30c penetrating in the thickness direction. As illustrated in FIG. 2, the openings 30a, 30b, and 30c are formed in each of the first insulating layer 21a, the first electrode layer 23a, the inter-electrode insulating layer 21b, the second electrode layer 23b, and the second insulating layer 21c. The openings 30a, 30b, and 30c are passages transmitting ions generated in the electrostatic charge removing unit 40 to the sucked surface of the first insulating layer 21a through the electrode pad 20. The above-mentioned openings 30a, 30b, and 30c can be arranged by properly distributing the same according to size of the electrode pad 20.

The electrostatic charge removing unit 40 can be implemented by various type ionizing apparatus such as corona discharge type ionizing apparatus, radiation projection type ionizing apparatus—for example, weak X-ray projection type ionizing apparatus, ultraviolet ray projection type ionizing apparatus, and the like. The electrostatic charge removing unit 40 can include a shower nozzle, a minus-shaped bar nozzle, and the like, and can be driven by one of a pulsed DC type, a DC type, and an AC type according to method of generating ions.

In this embodiment of the present invention, the electrostatic charge removing unit 40 includes three bar type discharging units 42a, 42b, and 42c and a second controller. The second controller is illustrated as being included in a controller 50 that also can include a first controller.

The respective discharging units 42a, 42b, and 42c are arranged in a minus type to correspond to the respective openings 30a, 30b, and 30c extending in a direction of the electrode pad 20. The direction along which the openings 30a, 30b, and 30c or the discharging units 42a, 42b, and 42c extend may be any one of a width direction, a longitudinal direction, and an orthogonal direction of the electrode pad 20 by considering the approximately rectangular electrode pad 20. In this embodiment of the present invention, the direction is illustrated in the width direction for the illustrative convenience.

Moreover, each of the discharging units 42a, 42b, and 42c includes a plurality of unit dischargers each of which has a later-describing discharging electrode and a ground electrode. When a high DC or AC voltage is applied to the discharging electrode, positive ions or negative ions are generated. The generated ions can be supplied to the sucked surface of the electrostatic chuck 10 through the openings 30a, 30b, and 30c of the electrode pad 20.

Operation of the electrostatic chuck 10 according to the embodiment of the present invention is as follows.

Firstly, when a first voltage V1 is applied to a pair of electrodes (referred to as "chucking electrodes"), a magnetic field is induced around the chucking electrodes, and an object near the electrostatic chuck 10 is charged and suctioned to the electrostatic chuck 10 due to the induced magnetic field. The first voltage V1 is about several hundreds volts to several kilovolts (kV).

Meanwhile, in order to draw (or suck) a large sized substrate, the voltage to be applied to the chucking electrodes is increased so as to increase the sucking force or the supporting force of the electrostatic chuck 10. In this case, the substrate is still drawn to the electrostatic chuck 10 even after cutting off the high voltage applied to the chucking electrodes. This is because a predetermined amount of electrostatic charges are remained between the electrostatic chuck 10 and the substrate even after cutting a high chucking voltage.

Next, when a second voltage V2 is applied to the discharging unit of the electrostatic charge removing unit 40, discharge occurs in the discharge electrode and ambient air is ionized. The generated ions move through the openings 30a, 30b, and 30c toward between the electrostatic chuck 10 and the substrate to neutralize electrostatic charges remaining there. The second voltage V2 may be about 120V or about 220V.

According to the above-mentioned embodiment of the present invention, when the substrate is not easily separated from the electrode pad 20 due to the electrostatic charges remaining between the first insulating layer 21a and the substrate even after cutting of the high chucking voltage, the ions generated from the electrostatic charge removing unit 40 are supplied to the sucked surface of the substrate through the openings 30a, 30b, and 30c so that the substrate can be easily separated from the electrode pad 20. That is, with using the electrostatic chuck 10 according to the embodiment of the present invention in handling a large sized glass substrate with a thickness of about 0.7 mm and sized by 1,870×2,200 mm, and 2,200×2,500 mm, it is possible to prevent handling errors, that is, to prevent the substrate from being leaned toward one side or slid during the dechucking.

Figure 3:
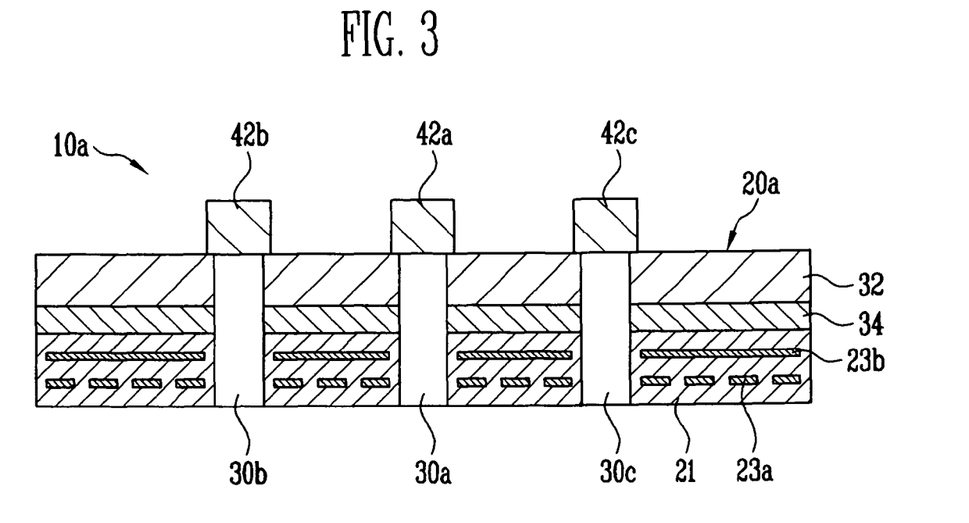
FIG. 3 is a cross-sectional view of the electrostatic chuck according to the embodiment of the present invention.

FIG. 3 is a cross-sectional view of the electrostatic chuck according to the embodiment of the present invention.

Referring to FIG. 3, an electrostatic chuck 10a according to this embodiment of the present invention includes an electrode pad 20a forming a sucking unit and discharging units 42a, 42b, and 42c forming an electrostatic charge removing unit. The electrode pad 20a includes an insulating plate 21, a first electrode layer 23a, a second electrode layer 23b, a supporting member 32, and a buffer layer 34.

The supporting member 32 is disposed to a side facing an attaching surface of the electrode pad 20a as a single body, supports the electrode pad 20a, and provides a predetermined strength. The supporting member 32 includes openings 30a, 30b, and 30c arranged to correspond to the above-mentioned openings 30a, 30b, and 30c of other elements (as shown in FIG. 2). The supporting member 32 includes a metal-based plate member. For example, the metal-based plate member includes an aluminum-based member such as an aluminum alloy.

The buffer layer 34 is disposed between the insulating plate 21 and the supporting member 32. The buffer layer 34 includes openings which are arranged to correspond to the above-mentioned openings 30a, 30b, and 30c of other elements (as shown in FIG. 2) and the openings 30a, 30b, and 30c of the supporting member 32. The buffer layer 34 may be made of resin such as polypropylene, rubber-based elastic body such as silicon rubber, and the like. When the buffer layer 34 is applied to the electrode pad 20a, flexibility is provided to the electrode pad 20a during the chucking so that contact rate of the substrate against a sucked surface can be improved.

A method of manufacturing the electrode pad is not limited. For example, the electrode pad having a laminated structure can be formed by sequentially laminating the first insulating layer, the first electrode layer, the inter-electrode layer, the second electrode layer, and the second insulating layer which have been described with reference to FIG. 2, and by thermally compressing under a predetermined heating and compression condition. The thermally compressed electrode pad 20a includes the insulating plate 21, and the first electrode layer 23a and the second electrode layer 23b which are laminate inside the insulating plate 21. The buffer layer 34 and the supporting member 32 are laminate together with the insulating layers and the electrode layers during the thermo-compression of the electrode pad to be thermally compressed or to be secondarily added after primarily thermally compressing the insulating layers and the electrode layers.

Figure 4:
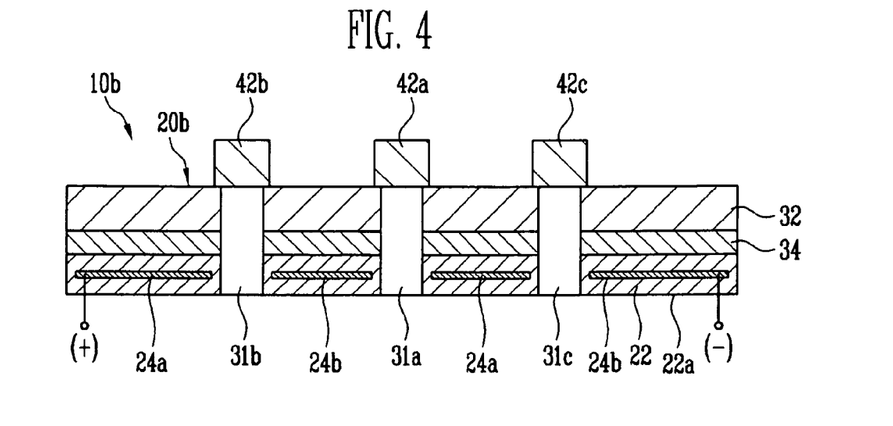
FIG. 4 is a cross-sectional view illustrating an electrostatic chuck according to another embodiment of the present invention.

FIG. 4 is a cross-sectional view illustrating an electrostatic chuck according to another embodiment of the present invention.

Referring to FIG. 4, an electrostatic chuck 10b according to this embodiment of the present invention includes an electrode pad 20b forming a sucking unit, and discharging units 42a, 42b, and 42c forming an electrostatic charge removing unit. The electrostatic charge removing unit is substantially identical to those which are described with reference to FIGS. 1 to 3, and a supporting member 32 and a buffer layer 34 of the electrode pad 20b are substantially identical to corresponding elements which are already described with reference to FIG. 3.

The electrode pad 20b includes an insulating plate 22, a first electrode layer 24a, and a second electrode layer 24b. The first electrode layer 24a and the second electrode layer 24b are positioned on a substantially same plane. The first electrode layer 24a and the second electrode layer 24b are spaced apart from each other and have a shape such as a pair of combs. Here, a single comb-shape may be referred to as a member indicated by a reference numeral 23a in FIG. 2. The first electrode layer 24a and the second electrode layer 24b form a pair of chucking electrodes. A positive voltage may be applied to the first electrode layer 24a and a negative voltage may be applied to or a ground may be connected to the second electrode layer 24b.

A distance between the first electrode layer 24a and the second electrode layer 24b can be properly selected by considering the fact that a chucking voltage is about 3 kV maximum when the distance is about 0.5 mm. However, since discharge between the electrode may occur when the distance between the first electrode layer 24a and the second electrode layer 24b is too short, there may be a limit of increasing the sucking force of the electrostatic chuck 10b rather than the electrode pad including the laminated electrode layers which is already described.

Moreover, the electrode pad 20b includes openings 31a, 31b, and 31c penetrating in the width direction. The openings 31a, 31b, and 31c form passages through which ions generated from the discharging units 42a, 42b, and 42c can be easily moved to the sucking face 22a of the electrode pad 20b. Preferably, the respective openings 31a, 31b, and 31c are installed to face the respective discharging units 42a, 42b, and 42c.

Figure 5:
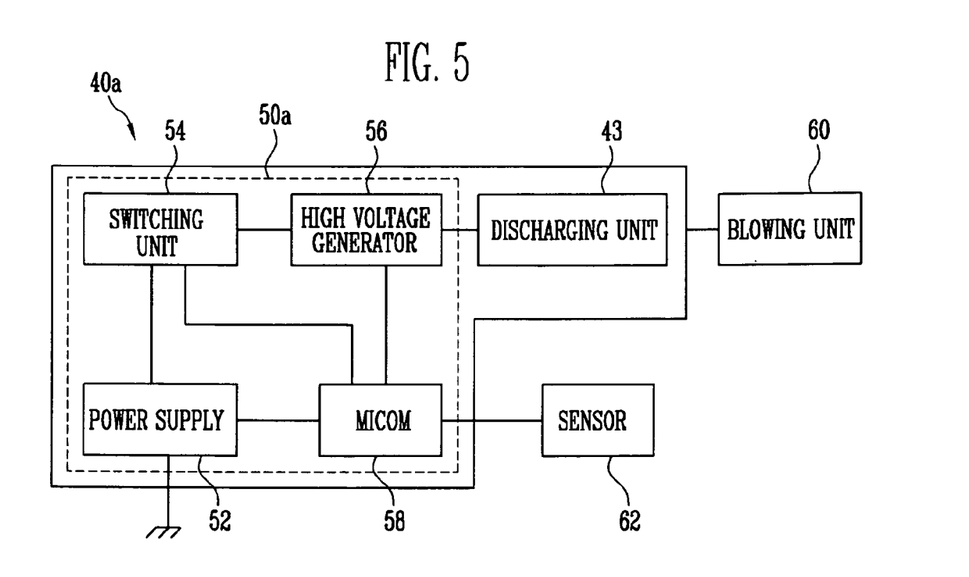
FIG. 5 is a schematic diagram illustrating an electrostatic charge removing unit applied to the electrostatic chuck according to the embodiment of the present invention.

FIG. 5 is a schematic diagram illustrating an electrostatic charge removing unit applied to the electrostatic chuck according to the embodiment of the present invention.

Referring to FIG. 5, an electrostatic charge removing unit 40a according to the embodiment of the present invention includes a discharging unit 43 and a second controller 50a.

The discharging unit 43 generates positive ions and negative ions using corona discharge when a predetermined voltage is applied from the second controller 50a. A face of the discharging unit 43 from which ions are discharged is disposed to face the openings formed in the electrode pad.

The second controller 50a includes a power supply 52, a switching unit 54, a high voltage generator 56, and a micro-computer 58. The power supply 52 supplies an internal power or an external power to the high voltage generator 56 and the micro-computer 58. The power supply 52 can include a voltage converter converting a first voltage level (for example, 24V) into a second voltage level (for example, 5V). The voltage converter can include a high voltage transistor, an inductor coil, and a Schottky diode or a high voltage transistor, a high voltage transformer, and a Schottky diode. The switching unit 54 allows or breaks an electrical connection between the power supply 52 and the high voltage generator 56 according to a control by the micro-computer 58. The high voltage generator 56 generates a high DC voltage (for example, 5 kV) by converting a predetermined DC voltage (for example, 24V) supplied from the power supply 52 and can supply the generated high voltage to the discharging unit 43. The high voltage generator 56 can be implemented by a high voltage transistor outputting high positive and negative pulses. The micro-computer 58 receives the electric power from the power supply 52 and controls overall operation of the second controller 50a.

Moreover, the electrostatic charge removing unit 40a may include a blowing unit 60 and a sensor 62. The blowing unit 60 forms a flow of fluid (for example, air flow) for compulsive transfer of the ions which are generated from the discharging unit 43 to the openings of the electrode pad. The sensor 62 senses a balanced state of the positive ions and negative ions which are generated by the corona discharge of the discharging unit 43 and transmits an output signal corresponding to the sensed state to the micro-computer 58.

Figure 6A:
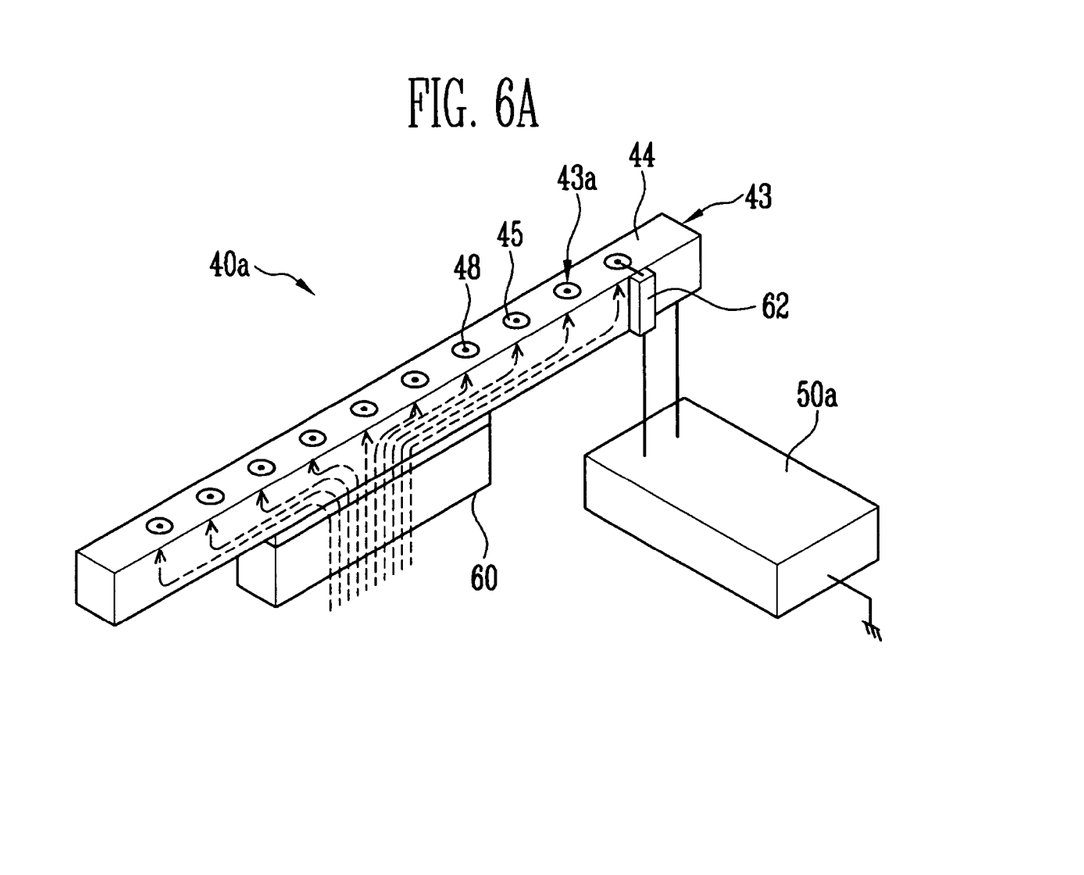
FIG. 6A is a perspective view illustrating the electrostatic charge removing unit applied to the electrostatic chuck according to the embodiment of the present invention.
Figure 6B:
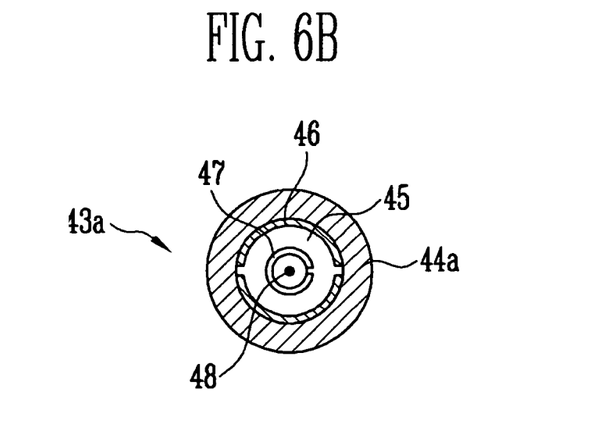
FIG. 6B is an enlarged plan view illustrating a part of a discharging unit of the electrostatic charge removing unit of FIG. 6A.

FIG. 6A is a perspective view illustrating the electrostatic charge removing unit applied to the electrostatic chuck according to the embodiment of the present invention. FIG. 6B is an enlarged plan view illustrating a part of a discharging unit of the electrostatic charge removing unit of FIG. 6A.

Referring to FIG. 6A, an electrostatic charge removing unit 40a according to this embodiment of the present invention includes a discharging unit 43, a second controller 50a, a blowing unit 60, and a sensor 62.

The discharging unit 43 includes a minus-shaped bar type housing 44 and a plurality of unit dischargers 43a. The housing 44 supports the plurality of unit dischargers 43a, and includes wires connecting the respective discharging units 43a to the second controller 50a and passages communicating the respective unit dischargers 43a with the blowing unit 60.

The plurality of unit dischargers 43a is approximately aligned with each other by a predetermined distance on a side of the housing 44. Each of the unit dischargers 43a has a nozzle shape. The side of the housing 44 on which the plurality of unit dischargers 43a are disposed can be installed to face the openings of the electrode pad forming a sucking unit of the electrostatic chuck.

Each of the respective unit dischargers 43a according to the embodiment of the present invention, as illustrated in FIG. 6B, includes an insulation nozzle body 44a, a ground electrode 46, a discharging electrode holder 47, and a discharging electrode 48. The insulation nozzle body 44a is disposed on a side of the housing 44 and has a hollow part and an open end. The insulation nozzle body 44a fixes the unit dischargers 43a to the housing 44 and electrically insulates the housing 44 from the ground electrode 46. The ground electrode 46 is disposed to cover a majority of inner surface of the hollow part of the nozzle body 44a. The discharging electrode holder 47 is fixed to the nozzle body 44a and is disposed at the center of the hollow part of the nozzle body 44a to be spaced apart from the ground electrode 46.

The discharging electrode 48 is coupled with and settled to the discharging electrode holder 47, and an end thereof is connected to the high voltage generator of the second controller 50a by a wire. The other end of the discharging electrode 48 can have a needle shape and can be disposed to face the openings of the electrode pad of the electrostatic chuck. The discharging electrode 48 can use a specialized durable electrode wear of which is prevented (for example, an electrode using an X-material).

Moreover, each of the unit dischargers 43a has a space formed between the ground electrode 46 and the discharging electrode holder 47. This space 45 is a passage through the fluid is flown by the blowing unit 60. The ions generated from the discharging electrode 48 can be introduced into the openings of the electrode pad by the fluid flow discharged to the outside through the space 45.

The blowing unit 60 is coupled with a side of the housing 44 and forms the fluid flow in each of the respective unit dischargers 43a which are arranged in the housing 44. The blowing unit 60 can be implemented by a blower making a wind using a pressure of a rubber tube and a fan to which an electric motor is mounted.

The sensor 62 can be coupled with a side of the housing 44, senses a balanced state of the positive ions and negative ions generated from at least one single unit discharger 43a, and transmits an output signal corresponding to the sensed state to the second controller 50a. An air ion concentrate gauge can be used as the sensor 62.

Figure 7:
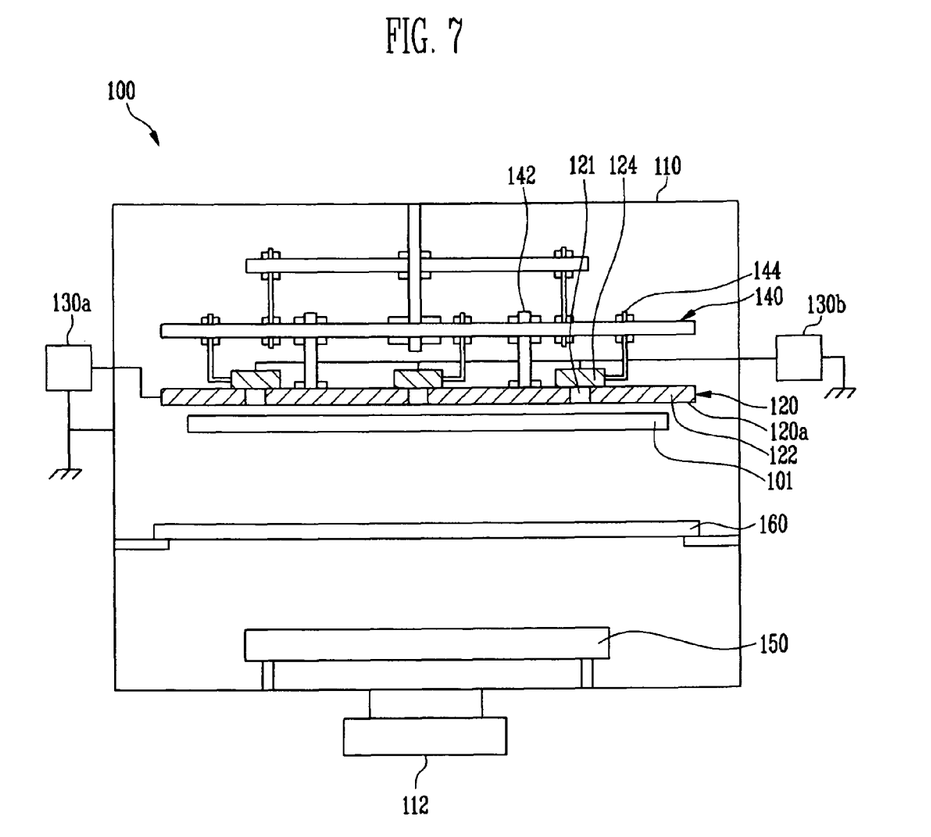
FIG. 7 is a schematic view illustrating an apparatus for manufacturing an OLED according to the present invention.

FIG. 7 is a schematic view illustrating an apparatus for manufacturing an OLED according to the present invention.

Referring to FIG. 7, the apparatus 100 for manufacturing an OLED according to the embodiment of the present invention includes a vacuum chamber 110, an electrostatic chuck 120, and a mechanical unit 140.

The vacuum chamber 110 includes a chamber providing high vacuum atmosphere under about $10^4$ kPa. The vacuum chamber 110 includes a vacuum pump 112 making the inside of the chamber a vacuum state. Nitrogen gas can be injected into the vacuum chamber 110 in order to prevent impurities from being scattered after a small amount of the impurities is extracted and accumulated around the discharging electrode that is disposed in the discharging unit 124.

The electrostatic chuck 120 includes an electrode pad 122 and a first controller 130a which form a sucking unit, a discharging unit 124 and a second controller 130b which form an electrostatic charge removing unit. The first controller 130a applies a first voltage to chucking electrodes of the electrode pad 122 and the second controller 130b applies a second voltage to dechucking electrodes of the discharging unit 124. The electrostatic chuck 120 draws (or sucks) and supports a substrate 101 in the face-down method.

The electrostatic chuck 120 of this embodiment of the present invention can include any one of the electrostatic chucks which are already described with reference to FIGS. 1 to 6B.

When the first controller 130a applies voltages to the chucking electrodes, a strong electric field is generated between the electrostatic chuck 120 and the substrate 101 and polarization is generated on the surface of the substrate 101. In this case, a potential difference and a columbic force are generated between a first surface 120a of the electrostatic chuck 120 and the substrate 101 so that the substrate 101 is drawn to the first surface 120a of the electrostatic chuck 120. The voltages applied to the chucking electrodes can be selected in a range of several hundred volts (V) to several kilovolts (kV). The voltage could be a positive or negative voltage.

Particularly, since a space between the electrostatic chuck 120 and substrate 101 is a vacuum state within the vacuum chamber 110, the substrate 101 is completely attached to the first surface 120a of the electrostatic chuck 120. This attached degree, that is, a contact rate can be increased when the insulation plate is made of polyimide and a buffer layer is disposed between the insulation plate and a supporting member in the electrode pad.

When the above-mentioned electrostatic chuck 120 is used, a glass substrate with a thickness of about 0.7 mm and a size of 1,870×2,200 mm or 2,200×2,500 mm can be stably transferred or fixed.

Meanwhile, the substrate 101 completely attached to the electrostatic chuck 120 has a tendency to still stick to the first face 120a of the electrostatic chuck 120 even after the high chucking voltage is cut off. Since this tendency affects control of the dechucking of the substrate 101 and disturbs smooth processing, and may bring damage of the substrate 101 during the dechucking. Therefore, in the apparatus 100 for manufacturing an OLED according to this embodiment of the present invention, a separated electrostatic charge removing unit is disposed in the electrostatic chuck 120 to control the dechuckcing.

When a predetermined voltage is applied from the second controller 130b to the discharging unit 124, positive ions and negative ions are generated by corona discharge of the discharging electrode. The generated ions move to the first surface 120a through openings 121 of the electrostatic chuck 120. At this time, when an effective charge removing distance between the discharging electrode and the substrate 101 is required, an extended passage of a predetermined length can be added between the discharging unit 124 and the electrostatic chuck 120. The extended passage can include a conduit extending the openings 121 of the electrostatic chuck 120 toward the discharging units 124 by a predetermined length.

According to the above-mentioned electrostatic chuck 120, the polarization and the potential difference of the surface of the substrate 101 are effectively canceled during the dechucking following the chucking of the substrate 101 so that the dechucking can be smoothly performed.

The mechanical unit 140 is disposed in the vacuum chamber 110, supports the electrostatic chuck 120, and moves the electrostatic chuck 120 in a desired direction. For example, the mechanical unit 140 can include a plurality of pin units coupled with the electrode pad of the electrostatic chuck 120, an association unit to which the plurality of pin units is fixed, and an elevation unit elevating the association unit. The elevation unit can include an elevation motor having a spiral shaft and a nut housing having an end connected to the spiral shaft and the other end connected to the association unit. The mechanical unit 140 can include a first mechanical unit 142 supporting and moving the electrode pad 122 of the electrostatic chuck 120 and a second mechanical unit 144 supporting and moving the discharging unit 124 of the electrostatic chuck 120.

The apparatus 100 of an OLED according to this embodiment of the present invention includes a deposition device forming an organic thin film or a conductive layer in red (R), green (G), and blue (B) on the substrate 101 in a predetermined pattern. In this case, the apparatus 100 may include an evaporation source 150 evaporating an organic material and metal onto the substrate by evaporating the same and a mask 160.

In the apparatus 100 including the electrostatic chuck 120 according to this embodiment of the present invention, the evaporation can be performed as follows. That is, after the mask 160 is disposed above the evaporation source 150 installed in the vacuum chamber 110 and the substrate 101 a thin film of which is formed is mounted above the mask 160 using the electrostatic chuck 120, a magnetic array (not shown) is driven to make the mask 160 be attached close to the substrate 101. Then, the evaporation source 150 is driven. An organic material installed in the evaporation source 150 is evaporated and passes through a slit of the mask 160 to be deposited on a side of the substrate 101 in a predetermined pattern.

When the electrostatic chuck 120 is used during the evaporation process, a large sized substrate can be chucked in the face-down method with a high flatness and the substrate 101 can be safely dechcucked after the evaporation. Therefore, the handling error of the large sized substrate is prevented and the substrate 101 is prevented from being damaged. Tact time (time for outputting a next substrate after outputting one substrate) can be reduced and yield and quality of complete products can be increased.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An electrostatic chuck comprising:
    an insulating plate having at least one opening penetrating the insulating plate;
    a pair of electrodes mounted in the insulating plate, the insulating plate being disposed between one of the pair of the electrodes and another of the pair of the electrode, each of the electrodes having at least one opening overlapping the at least one opening of the insulating plate;
    a first controller applying a voltage to the pair of electrodes; and
    an electrostatic charge removing unit disposed near the insulating plate and emitting ions into the at least one opening of the insulating plate to remove electrostatic charges positioned around a side of the insulating plate.

2. The electrostatic chuck as claimed in claim 1, wherein the at least one opening of the insulating plate has a stripe shape extending in a direction parallel to an edge of the insulating plate.

3. The electrostatic chuck as claimed in claim 1, wherein the pair of electrodes is arranged in a laminated structure.

4. The electrostatic chuck as claimed in claim 1, wherein one of the pair of the electrodes and another of the pair of the electrodes are arranged on the same plane that is substantially parallel to a surface of the insulating plate on which the at least one opening of the insulating plate is formed.

5. The electrostatic chuck as claimed in claim 1, wherein the insulating plate is made of a material including resin or ceramic.

6. The electrostatic chuck as claimed in claim 1, further comprising a supporting member supporting the insulating plate.

7. The electrostatic chuck as claimed in claim 6, further comprising a buffer layer formed between the insulating plate and the supporting member.

8. The electrostatic chuck as claimed in claim 1, wherein the electrostatic charge removing unit comprises:
    a discharging unit generating ions by corona discharge; and
    a second controller applying a voltage to the discharging unit.

9. The electrostatic chuck as claimed in claim 8, wherein the discharging unit is arranged to cover the at least one opening of the insulating plate.

10. The electrostatic chuck as claimed in claim 8, wherein the electrostatic charge removing unit further comprises a blowing unit compulsively blowing the ions generated in the discharging unit to the at least one opening of the insulating plate.

11. The electrostatic chuck as claimed in claim 8, wherein the electrostatic charge removing unit further comprises a sensor sensing a balanced state of positive ions and negative ions which are generated in the discharging unit and transmitting an output signal with respect to the sensed balanced state to the second controller.

12. An apparatus for manufacturing an organic light emitting diode comprising:
    a vacuum chamber;
    an electrostatic chuck supporting a substrate in the vacuum chamber; and
    a mechanical unit coupled with the vacuum chamber and supporting and moving the electrostatic chuck, wherein the electrostatic chuck comprises:
    an insulating plate having at least one opening penetrating the insulating plate;
    a pair of electrodes mounted in the insulating plate, the insulating plate being disposed between one of the pair of the electrodes and another of the pair of the electrode, each of the electrodes having at least one opening overlapping with the at least one opening of the insulating plate;
    a first controller applying a voltage to the pair of electrodes; and
    an electrostatic charge removing unit disposed near the insulating plate and emitting ions into the at least one opening of the insulating plate to remove electrostatic charges positioned around a side of the insulating plate.

13. The apparatus as claimed in claim 12, wherein the mechanical unit comprises:
    a first mechanical unit supporting the insulating plate of the electrostatic chuck; and
    a second mechanical unit supporting the electrostatic charge removing unit of the electrostatic chuck.

14. The apparatus as claimed in claim 12, further comprising an evaporation source evaporating an organic material or metal to a surface of the substrate.

15. The apparatus as claimed in claim 12, wherein the at least one opening of the insulating plate has a stripe shape extending in a direction parallel to an edge of the insulating plate.

16. The apparatus as claimed in claim 12, wherein the pair of electrodes is arranged in a laminated structure.

17. The apparatus as claimed in claim 12, wherein one of the pair of the electrodes and another of the pair of the electrodes are arranged on the same plane that is substantially parallel to a surface of the insulating plate on which the at least one opening of the insulating plate is formed.

18. The apparatus as claimed in claim 12, wherein the electrostatic charge removing unit comprises:
    a discharging unit generating ions by corona discharge; and
    a second controller applying a voltage to the discharging unit.

19. The apparatus as claimed in claim 18, wherein the electrostatic charge removing unit further comprises a blowing unit for compulsively blowing the ions generated in the discharging unit to the at least one opening of the insulating plate.

20. The apparatus as claimed in claim 18, wherein the electrostatic charge removing unit further comprises a sensor sensing a balanced state of positive ions and negative ions which are generated in the discharging unit and transmitting an output signal with respect to the sensed balanced state to the second controller.

* * * * *